United States Patent
Park et al.

(10) Patent No.: US 7,382,206 B2
(45) Date of Patent: Jun. 3, 2008

(54) VOLTAGE CONTROLLED OSCILLATOR WITH BODY OF TRANSISTORS BIAS CONTROL

(75) Inventors: Dong Min Park, Busan (KR); Seong Hwan Cho, Daejeon (KR); Tah Joon Park, Kyungki-Do (KR); Yong Il Kwon, Kyungki-Do (KR); Joon Hyung Lim, Kyungki-Do (KR); Myeung Su Kim, Kyungki-Do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 69 days.

(21) Appl. No.: 11/534,453

(22) Filed: Sep. 22, 2006

(65) Prior Publication Data

US 2007/0080754 A1   Apr. 12, 2007

(30) Foreign Application Priority Data

Oct. 11, 2005   (KR) .................... 10-2005-0095747

(51) Int. Cl.
*H03L 5/00* (2006.01)
*H03B 5/18* (2006.01)

(52) U.S. Cl. .................. 331/182; 331/185; 331/117 R; 331/176

(58) Field of Classification Search ................ 331/182, 331/183, 185, 117 R, 167
See application file for complete search history.

(56) References Cited

U.S. PATENT DOCUMENTS

| 6,867,656 B2 | 3/2005 | Hajimiri et al. |
| 7,002,420 B2 * | 2/2006 | Ngo .......................... 331/57 |
| 7,132,901 B2 * | 11/2006 | Cojocaru .............. 331/117 FE |
| 7,167,062 B2 * | 1/2007 | van Zeijl .................... 331/185 |

* cited by examiner

*Primary Examiner*—Joseph Chang
(74) *Attorney, Agent, or Firm*—Lowe Hauptman Ham & Berner

(57) ABSTRACT

In a voltage controlled oscillator, a resonant circuit generates a resonant frequency in response to a tuning voltage. A differential oscillator includes first and second transistors differentially cross-coupled to the resonant circuit. The first and second transistors supply energy to the resonant circuit to oscillate the resonant frequency from the resonant circuit, thereby generating first and second oscillation signals having a phase difference of 180 degree. Also, the first and second transistors adjust the first and second oscillation signals to a uniform level in response to a body bias voltage. In addition, an output level detector detects a level of the first and second oscillation signals from the differential oscillator and supplies the body bias voltage corresponding to the detected level to a body of each of the first and second transistors.

9 Claims, 7 Drawing Sheets

VOLTAGE CONTROLLED OSCILLATOR WITH BODY OF TRANSISTORS BIAS CONTROL

CLAIM OF PRIORITY

This application claims the benefit of Korean Patent Application No. 2005-95747 filed on Oct. 11, 2005 in the Korean Intellectual Property Office, the disclosure of which is incorporated herein by reference.

BACKGROUND OF THE INVENTION

1. Field of the Invention

The present invention relates to a voltage controlled oscillator (VCO) employed in a frequency synthesizer of a low-power system. More particularly, the present invention relates to a voltage controlled oscillator with body bias control which can generate an oscillation signal of a uniform level without being affected by changes in a supply power.

2. Description of the Related Art

Recently the IEEE 802.15.4 (ZigBee) standard has garnered attention and found its application in home network, security and logistics where short-distance and low-speed transmission is required. A telecommunication system applied to such applications characteristically needs to run on one long-lasting battery, and thus at low power.

Meanwhile a frequency synthesizer of an RF transceiver operates during both transmission and reception to generate a local oscillation frequency, thereby consuming power considerably. In this frequency synthesizer, most power is dissipated by a voltage controlled oscillator (VCO) and a divider. Accordingly, studies are under way to reduce current dissipated by two blocks of the voltage controlled oscillator and the divider.

Most of all, recently, studies have been vigorously conducted to reduce power by a lowered supply voltage rather than by a structural approach.

FIG. 1 is a circuit diagram illustrating a conventional voltage controlled oscillator.

The conventional voltage controlled oscillator of FIG. 1 includes a resonant circuit 11 and a differential cross-coupled oscillation circuit 12. The resonant circuit 11 resonates at a supply voltage Vdd of about 1.8V to 3.3V and generates a resonant frequency in response to a tuning voltage VT. The differential cross-coupled oscillation circuit 12 supplies energy to the resonant frequency from the resonant circuit 11 to generate first and second signals Sout1 and Sout2 having a phase difference of 180 degree.

The differential cross-coupled oscillation circuit 12 includes a pair of first and second differential cross-coupled transistors M1 and M2. Here, the first transistor M1 has a drain connected to a first end of the resonant circuit 11 and a gate of the second transistor M2, a gate connected to a second end of the resonant circuit 11 and a drain of the second transistor M2, and a source connected to a ground. The second transistor M2 has a drain connected to a second end of the resonant circuit 11 and the gate of the first transistor M2, a gate connected to the first end of the resonant circuit 11 and the drain of the first transistor M2, and a source connected to the ground.

Also, the first and second transistors M1 and M2 each have a body bias connected to the ground.

Such a voltage controlled oscillator is typically referred to as a differential cross-coupled LC-tuned VCO.

But the conventional voltage controlled oscillator, when used at a low supply voltage of about 0.5V, cannot adopt a stack structure with many transistors. Accordingly, the voltage controlled oscillator is structured such that an inductor is connected to a negative gm cell via load.

In this case, the lower supply voltage considerably narrows a frequency range of an oscillator. Also, in this structure, many capacitor arrays are used to accommodate a desired frequency band, thereby creating parasitic components significantly.

Furthermore, to ensure stable oscillation, the negative gm cell should be designed in a large size. This noticeably changes an oscillation frequency and the oscillator performs sensitively in response to changes in the supply voltage.

Therefore, there is a demand for a voltage controlled oscillator of a new structure which can compensate for changes in the supply voltage and oscillate stably.

SUMMARY OF THE INVENTION

The present invention has been made to solve the foregoing problems of the prior art and therefore an object according to certain embodiments of the present invention is to provide a voltage controlled oscillator employed in a frequency synthesizer of a low-power system, and more particularly a voltage controlled oscillator with body bias control which constantly generates an oscillation signal of a uniform level without being affected by changes in a supply power.

According to an aspect of the invention for realizing the object, there is provided a voltage controlled oscillator with body bias control including a resonant circuit for generating a resonant frequency in response to a tuning voltage; a differential oscillator including first and second transistors differentially cross-coupled to the resonant circuit, the first and second transistors supplying energy to the resonant circuit to oscillate the resonant frequency from the resonant circuit, thereby generating first and second oscillation signals having a phase difference of 180 degree, and adjusting the first and second oscillation signals to a uniform level in response to a body bias voltage; and an output level detector for detecting a level of the first and second oscillation signals from the differential oscillator and supplying the body bias voltage corresponding to the detected level to a body of each of the first and second transistors.

Each of the first and second transistors comprises an n-channel Metal Oxide Semiconductor (MOS) transistor.

The first transistor has a drain connected to a first connecting node between a first end of the resonant circuit and a gate of the second transistor, a gate connected to a second connecting node between a second end of the resonant circuit and a drain of the second transistor, a source connected to a ground and a body connected to the body bias voltage of the output level detector.

The second transistor has a drain connected to a second connecting node between a second end of the resonant circuit and the gate of the first transistor, a gate connected to the first connecting node between the first end of the resonant circuit and the drain of the first transistor, a source connected to the ground and a body connected to the body bias voltage of the output level detector.

The output level detector comprises an n-channel MOS transistor having a drain connected to the first connecting node connected to the first end of the resonant circuit, a gate connected to the second connecting node connected to the second end of the resonant circuit, and a source commonly connected to the bodies of the first and second transistors.

Each of the first and second transistors comprises a p-channel MOS transistor.

The first transistor has a drain connected to a first connecting node between a first end of the resonant circuit and a gate of the second transistor, a gate connected to a second connecting node between a second end of the resonant circuit and a drain of the second transistor, a source connected to a supply voltage and a body connected to the body bias voltage of the output level detector.

The second transistor has a drain connected to the second connecting node between the second end of the resonant circuit and the gate of the first transistor, a gate connected to the first connecting node between the first end of the resonant circuit and the drain of the first transistor, a source connected to the supply voltage and a body connected to the body bias voltage of the output level detector.

The output level detector comprises a p-channel MOS transistor having a source connected to the first connecting node between the first end of the resonant circuit and the drain of the first transistor, a gate connected to the second connecting node between the second end of the resonant circuit and the drain of the second transistor, and a drain commonly connected to the bodies of the first and second transistors.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
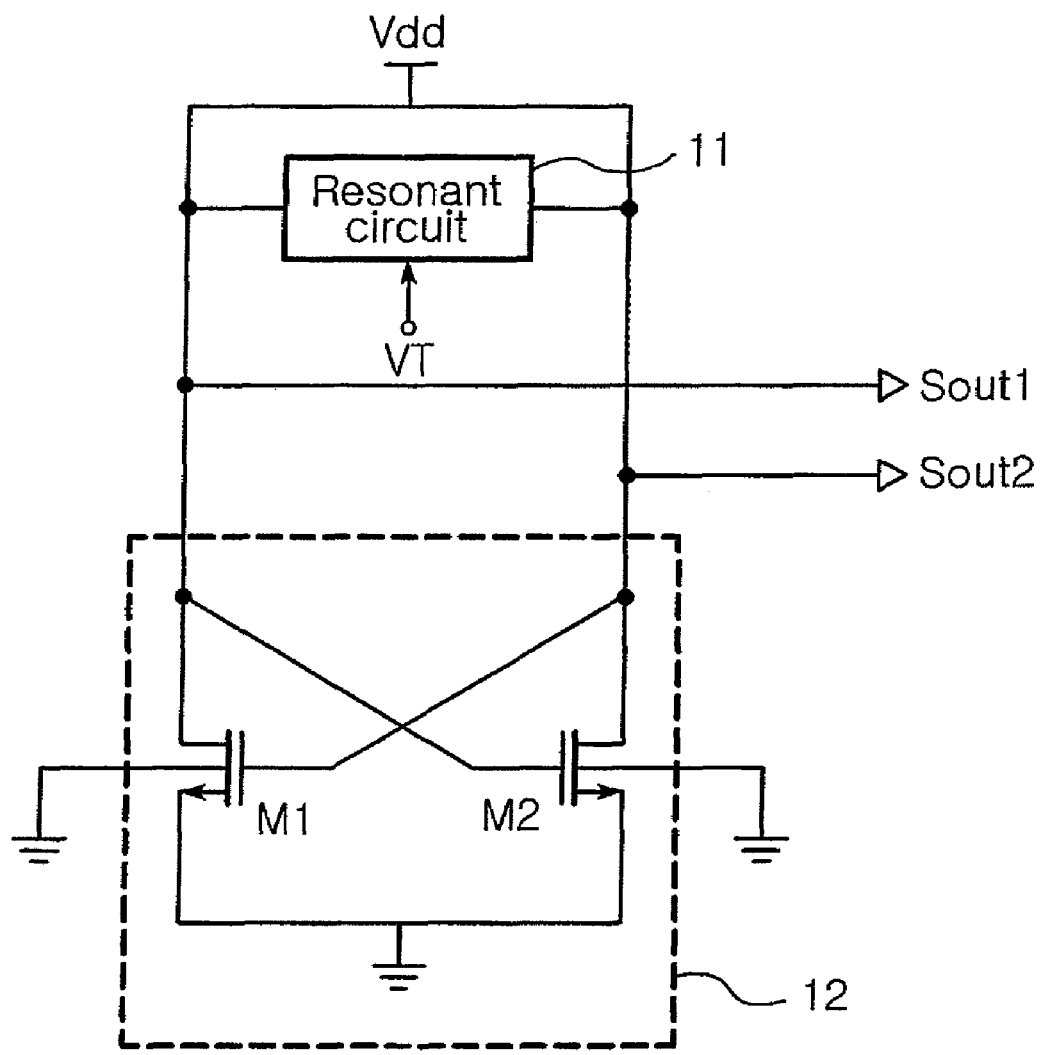
FIG. 1 is a circuit diagram illustrating a conventional voltage controlled oscillator.

Preferred embodiments of the present invention will now be described in detail with reference to the accompanying drawings, in which the same reference numerals are used throughout the different drawings to designate the same or similar components.

Figure 2:
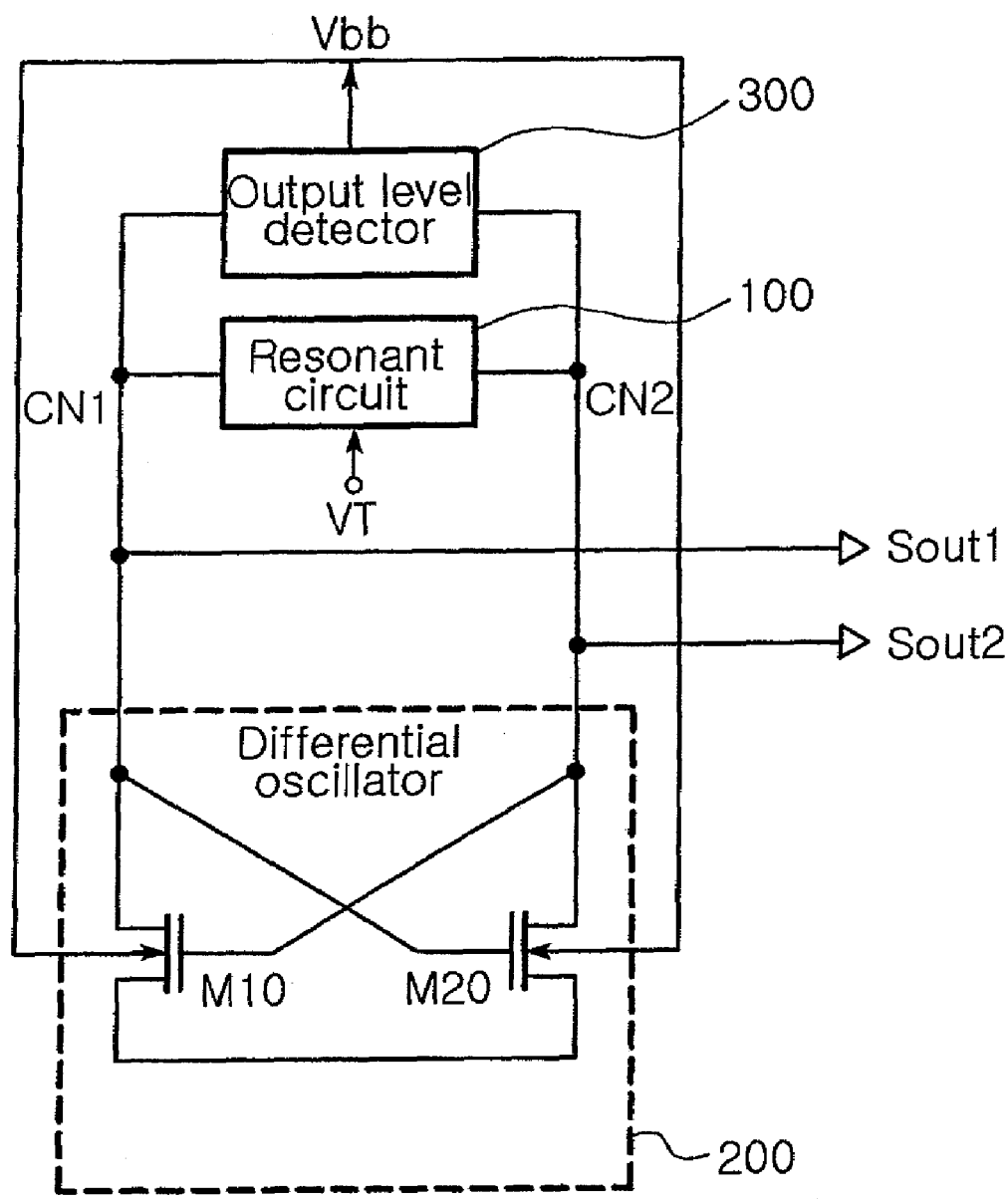
FIG. 2 is a circuit diagram illustrating a voltage controlled oscillator of the invention.

FIG. 2 is a circuit diagram illustrating a voltage controlled oscillator according to the invention.

Referring to FIG. 2, the voltage controlled oscillator includes a resonant circuit 100, a differential oscillator 200 and an output level detector 300. The voltage controlled oscillator of the invention can be utilized at a low supply voltage of about 0.5V.

The resonant circuit 100 generates a resonant frequency in response to a tuning voltage VT. The resonant circuit 100 may adopt a known circuit. For example, the resonant circuit 100 may include an inductor L, a capacitor C and a variable capacitance device such as a varactor diode in which capacitance is varied by the tuning voltage VT.

The differential oscillator 200 includes first and second transistors M10 and M20 which are cross-coupled to the resonant circuit 100. The first and second transistors M10 and M20 supply energy to the resonant circuit 100 to oscillate the resonant frequency of the resonant circuit 100, thereby generating first and second signals Sout1 and Sout2 having a phase difference of 180 degree. Also, the first and second transistors M10 and M20 adjust the first and second oscillation signals Sout1 and Sout2 to a uniform level in response to a body bias voltage Vbb.

The output level detector 300 detects a level of the first and second oscillation signals Sout1 and Sout2 of the differential oscillator 200 and supplies the body bias voltage Vbb corresponding to the detected level to a body of each of the first and second transistors M10 and M20.

Here, in a case where the supply voltage Vdd is 0.5V, the body bias voltage Vbb reaches up to 1.0V (supply voltage+ detected voltage) since the detected voltage of 0.5V is added to the supply voltage Vdd of 0.5V. Therefore, as just described, the voltage controlled oscillator of the invention can be utilized at a low supply voltage of about 0.5V.

Figure 3:
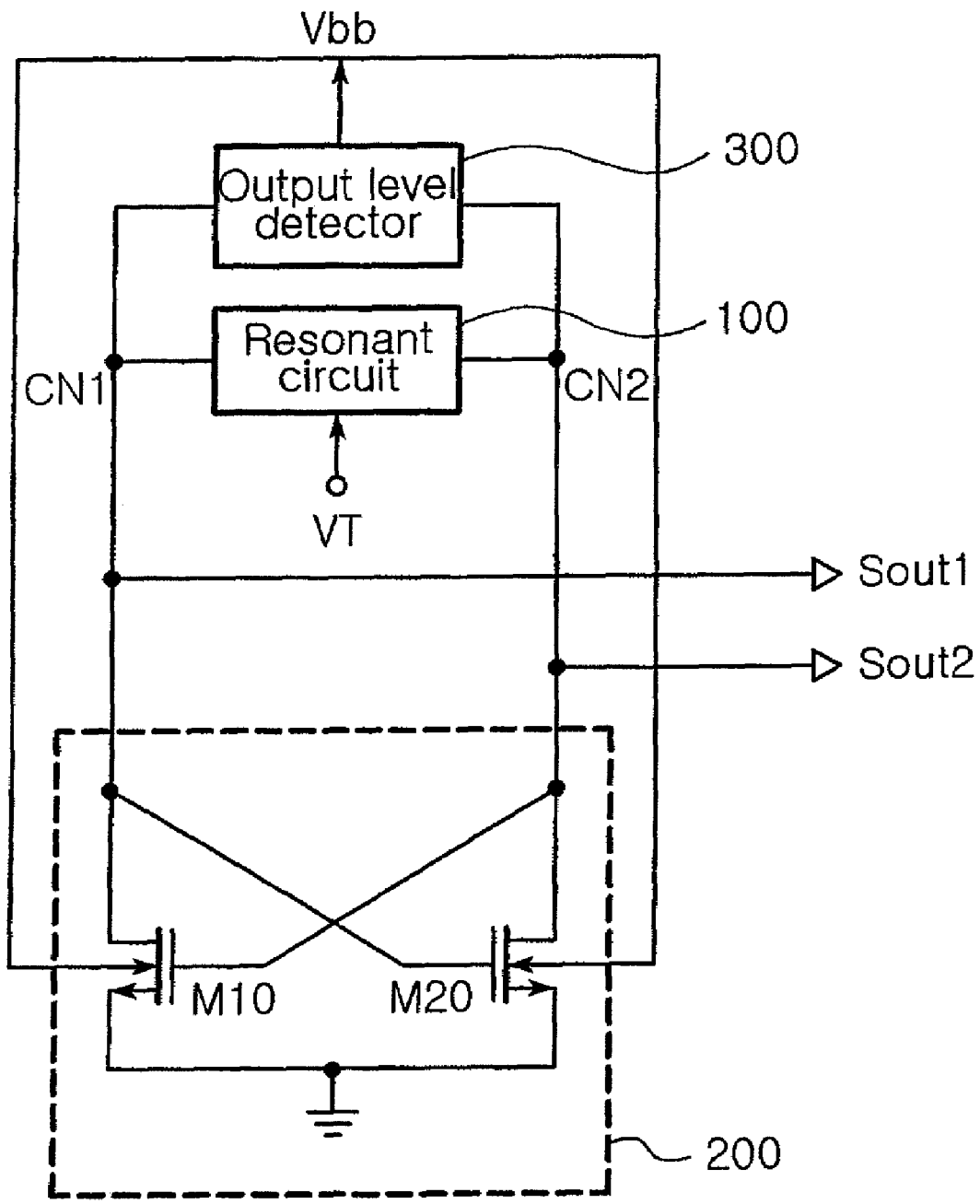
FIG. 3 is a circuit diagram illustrating a voltage controlled oscillator according to a first embodiment of the invention.

FIG. 3 is a circuit diagram illustrating a voltage controlled oscillator according to a first embodiment of the invention.

Referring to FIG. 3, in the voltage controlled oscillator according to the first embodiment of the invention, each of first and second transistors M10 and M20 is configured as an n-channel Metal Oxide Semiconductor (MOS) transistor.

The first transistor M10 has a drain connected to a first connecting node CN1 between a first end of a resonant circuit 100 and a gate of the second transistor M20, a gate connected to a second connecting node CN2 between a second end of the resonant circuit 100 and a drain of the second transistor M20, a source connected to a ground, and a body connected to a body bias voltage Vbb of an output level detector 300.

The second transistor M20 has a drain connected to the second connecting node CN2 between the second end of the resonant circuit 100 and the gate of the first transistor M10, a gate connected to the first connecting node CN1 between the first end of the resonant circuit 100 and the drain of the first transistor M10, a source connected to the ground and a body connected to the body bias voltage of the output level detector 300.

Figure 4:
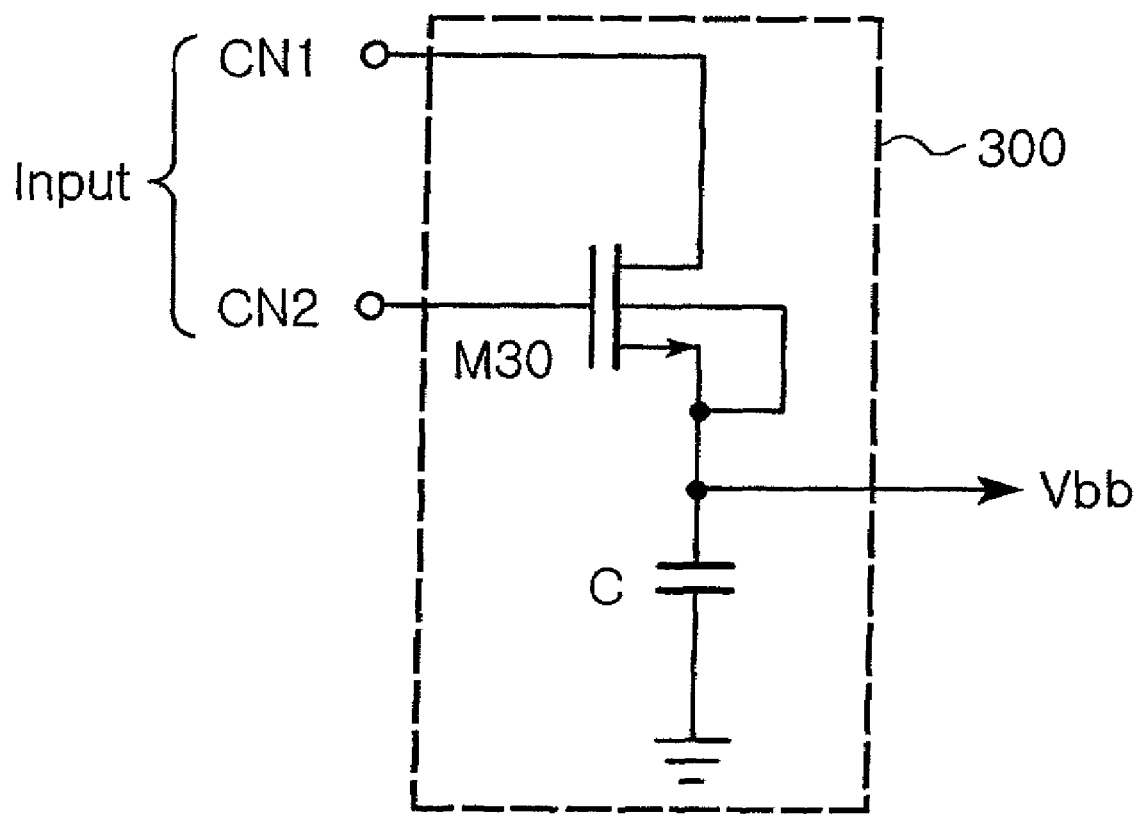
FIG. 4 is a circuit diagram illustrating an output level detector of FIG. 3.

FIG. 4 is a circuit diagram illustrating the output level detector of FIG. 4.

Referring to FIG. 4, the output level detector 300 is configured as an n-channel MOS transistor M30 having a drain connected to a first connecting node CN1 connected to a first end of the resonant circuit 100, a gate connected to a second connecting node CN2 connected to a second end of the resonant circuit 11, and a source commonly connected to a body of each of the first and second transistors M10 and M20.

As described above, referring to FIGS. 2 to 4, in a case where each of the first and second transistors M10 and M20 of the differential oscillator 200 is configured as an n-channel MOS transistor M30, the output level detector 300 is also configured as an n-channel MOS transistor M30.

Figure 5:
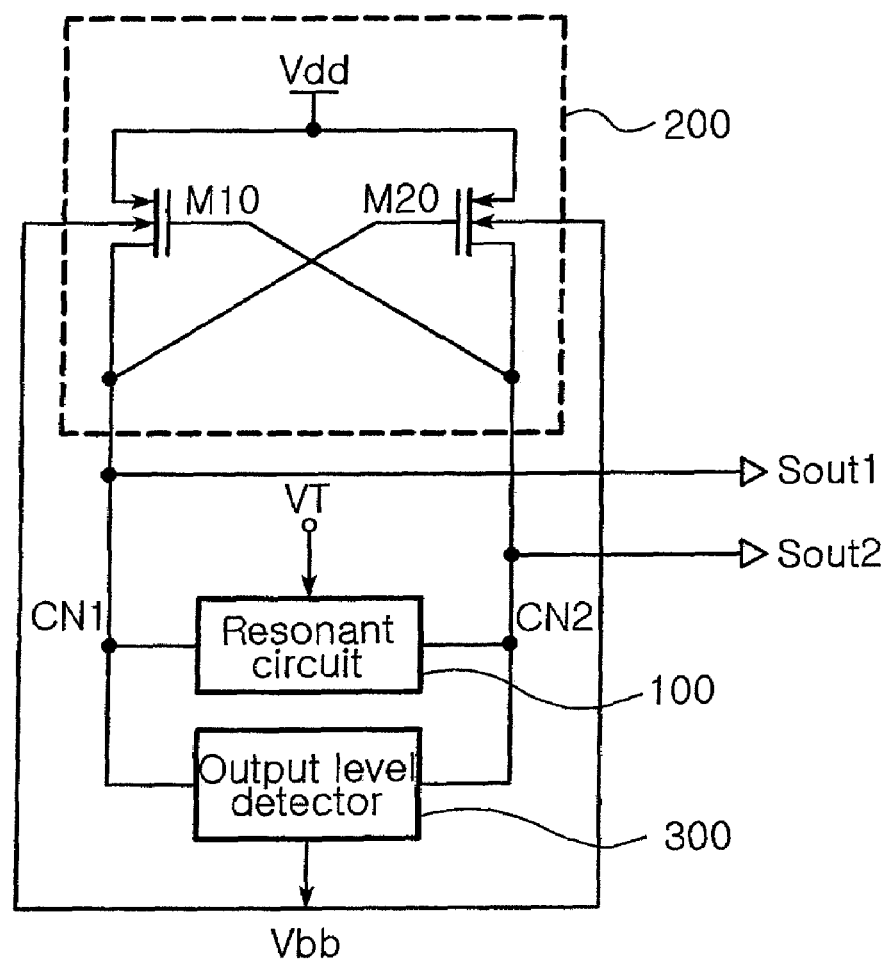
FIG. 5 is a circuit diagram illustrating a voltage controlled oscillator according to a second embodiment of the invention.

FIG. 5 is a circuit diagram illustrating a voltage controlled oscillator according to a second embodiment of the invention.

Referring to FIG. 5, in the voltage controlled oscillator according to the second embodiment of the invention, each of first and second transistors M10 and M20 is configured as a p-channel MOS transistor.

The first transistor M10 has a drain connected to a first connecting node CN1 between a first end of the resonant circuit 11 and a gate of the second transistor M20, a gate connected to a second connecting node CN2 between a second end of a resonant circuit 100 and a drain of the second transistor M20, a source connected to a supply voltage Vdd and a body connected to a body bias voltage of an output level detector 300.

The second transistor M20 has a drain connected to the second connecting node CN2 between a second end of the resonant circuit 100 and the gate of the first transistor M10, a gate connected to the first connecting node CN1 between the first end of the resonant circuit 100 and the drain of the first transistor M10, a source connected to the supply voltage Vdd and a body connected to the body bias voltage of the output level detector 300.

Figure 6:
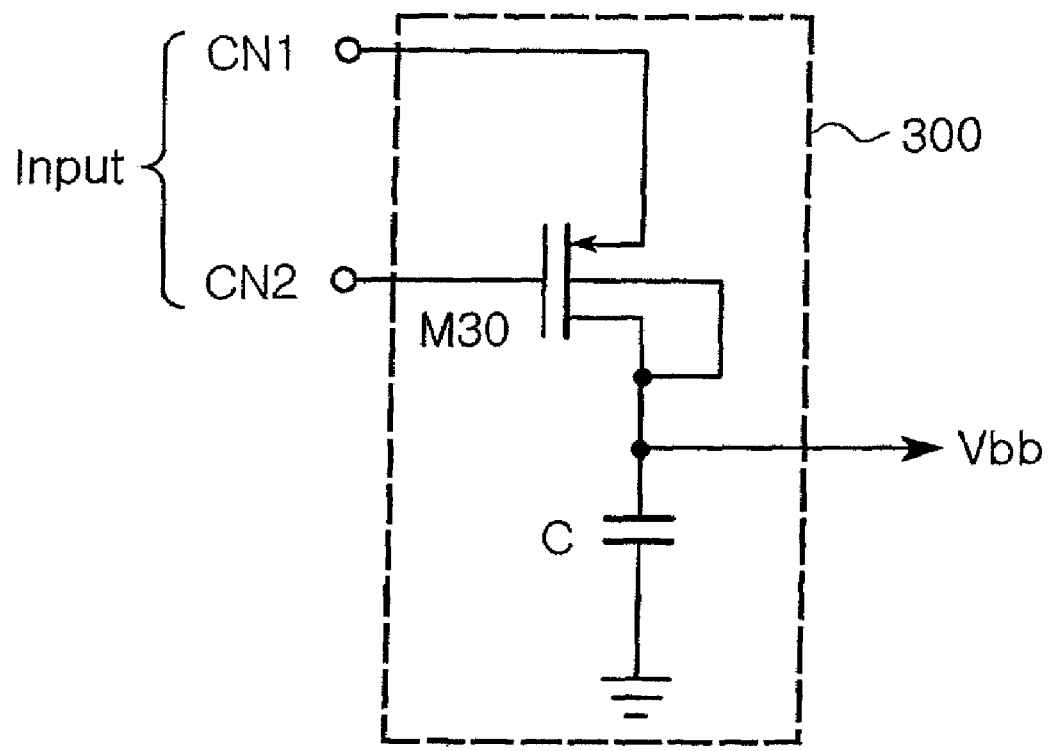
FIG. 6 is a circuit diagram illustrating an output level detector of FIG. 5.

FIG. 6 is a circuit diagram illustrating the output level detector of FIG. 5.

Referring to FIG. 5 and FIG. 6, the output level detector 300 is configured as a p-channel MOS transistor M30 having a source connected to a first connecting node CN1 between the first end of the resonant circuit 100 and the drain of the first transistor M10, a gate connected to a second connecting node CN2 between the second end of the resonant circuit 11 and the drain of the second transistor M20 and a drain commonly connected to a body of each of the first and second transistors M10 and M20.

As described above, referring to FIGS. 2, 5 and 6, in a case where the first and second transistors M10 and M20 are configured as a p-channel MOS transistor, the output level detector 300 is also configured as a p-channel transistor.

The operations and effects of the invention will be explained in detail hereunder with reference to the accompanying drawings.

A voltage controlled oscillator of the invention generates an oscillation signal determined in response to a tuning voltage VT. The voltage controlled oscillator of the invention will be explained with reference to FIGS. 2 to 6.

Referring to FIG. 2, the resonant circuit 100 of the invention generates a resonant frequency in response to a tuning voltage.

Here, the differential oscillator 200 of the invention includes the first and second transistors M10 and M20 which are differentially cross-coupled to the resonant circuit 100. The first and second transistors M10 and M20 supply energy to the resonant circuit 100 to oscillate the resonant frequency of the resonant circuit 100, thereby generating first and second oscillation signals Sout1 and Sout 2 having a phase difference of 180 degree.

The output level detector 300 detects a level of the first and second oscillation signals Sout1 and Sout 2 from the differential oscillator 200 and supplies a body bias voltage Vbb (0V to 1.0V) corresponding to the detected level to a body of each of the first and second transistors.

Here, as described above, the body bias voltage Vbb ranges from 0V to 1.0V so that it is possible to control the first and second transistors M10 and M20.

Accordingly, the differential oscillator 200 adjusts the first and second oscillation signals Sout1 and Sout 2 to a uniform level in response to the body bias voltage Vbb.

Meanwhile, the differential oscillator 200 can be configured as in FIG. 3. Referring to FIGS. 2 and 3, each of the first and second transistors M10 and M20 is structured as an n-channel MOS transistor. Here, the first transistor M10 has a drain connected to the first connecting node CN1 between the first end of the resonant circuit 11 and the gate of the second transistor M20, a gate connected to the second connecting node CN2 between the second end of the resonant circuit 100 and the drain of the second transistor M20, a source connected to the ground and a body connected to the body bias voltage Vbb of the output level detector 300.

Likewise, the second transistor M20 has a drain connected to the second connecting node CN2 between the second end of the resonant circuit 100 and the gate of the first transistor M10, a gate connected to the first connecting node CN1 between the first end of the resonant circuit 100 and the drain of the first transistor M10, a source connected to the ground and a body connected to the body bias voltage of the output level detector 300.

In this voltage controlled oscillator according to the first embodiment of the invention, in a case where each of the first and second transistors M10 and M20 is configured as an n-channel MOS transistor, the output level detector 300 of the invention can be structured as in FIG. 4.

Referring to FIG. 4, the output level detector 300 detects a level of the oscillation signal between the first connecting node CN1 connected to the first end of the resonant circuit 100 and the second connecting node CN2 connected to the second end of the resonant circuit 100. The output level detector 300 supplies a low body bias voltage to a body of each of the first and second transistors M10 and M20 if the detected level is low. On the other hand, the output level detector 300 supplies a high body bias voltage to the first and second transistors M10 and M20 if the detected level is high.

Figure 7:
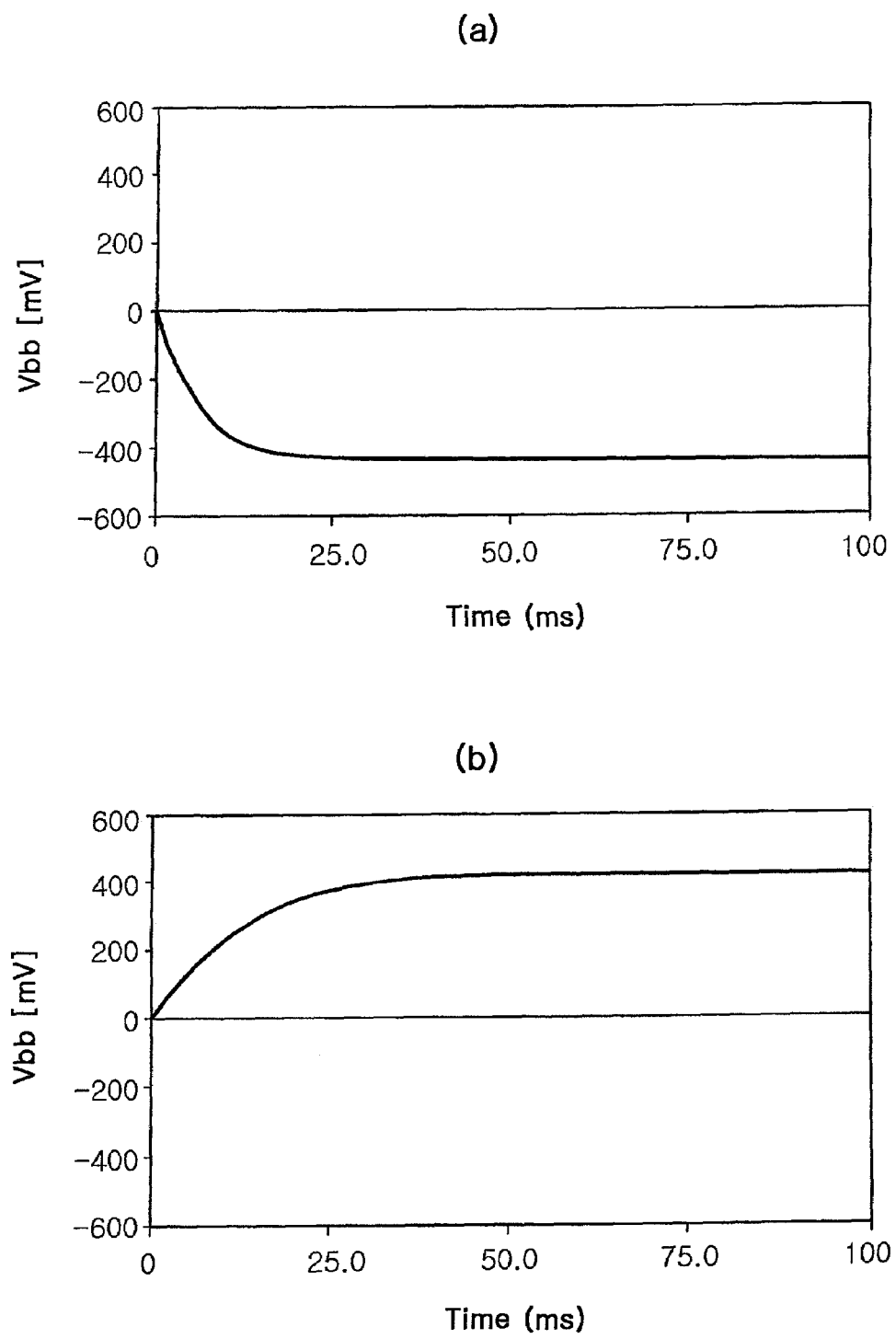
FIGS. 7a and 7b are graphs illustrating a body bias voltage according to the invention.

Accordingly, as shown in FIG. 7a, if the body bias voltage from the output level detector 300 is high, the first and second transistors M10 and M20 are reduced in their driving power, thereby lowering the level of the oscillation signal from the differential oscillator. On the other hand, if the body bias voltage from the output level detector 300 is low, the first and second transistors M10 and M20 are improved in their driving power, thereby increasing the level of the oscillation signal from the differential oscillator.

Meanwhile, the differential oscillator 200 of the invention can be configured as in FIG. 5. Referring to FIGS. 2 and 5, each of the first and second transistors M10 and M20 is configured as a p-channel MOS transistor. Here, the first transistor M10 has a drain connected to the first connecting node CN1 between the first end of the resonant circuit 11 and the gate of the second transistor M20, a gate connected to the second connecting node CN2 between the second end of the resonant circuit 100 and the drain of the second transistor M20, a source connected to the supply power Vdd and a body connected to the body bias voltage of the output level detector 300.

Likewise, the second transistor M20 has a drain connected to the second connecting node CN2 between the second end of the resonant circuit 100 and the gate of the first transistor M10, a gate connected to the first connecting node CN1 between the first end of the resonant circuit 100 and the drain of the first transistor M10, a source connected to the supply voltage Vdd and a body connected to the body bias voltage of the output level detector 300.

In this voltage controlled oscillator according to the second embodiment of the invention, in a case where each of the first and second transistors M10 and M20 is configured as a p-channel MOS transistor M30, the output level detector 300 of the invention can be structured as in FIG. 6.

Referring to FIG. 5, the output level detector 300 detects the level of the oscillation signal between the first connecting node CN1 connected to the first end of the resonant circuit 100 and the second connecting node CN2 connected to the second end of the resonant circuit 100. The output level detector 300 supplies a high body bias voltage to the bodies of the first and second transistors M10 and M20 if the detected level is high. On the other hand, the output level detector 300 supplies a low body bias voltage to the bodies of the first and second transistors M10 and M20 if the detected level is low.

Accordingly, as shown in FIG. 7b, if the body bias voltage Vbb from the output level detector 300 is high, the first and second transistors M10 and M20 are reduced in their driving power, thereby lowering the level of the oscillation signal.

On the other hand, if the body bias voltage Vbb from the output level detector 300 is low, the first and second transistors M10 and M20 are improved in their driving power, thereby increasing the level of the oscillation signal.

As set forth above, according to preferred embodiments of the invention, a voltage controlled oscillator is employed in a frequency synthesizer of a low power system to generate a uniform level of an oscillation signal without being affected by changes in a supply power.

More specifically, according to the invention, the voltage controlled oscillator senses oscillation and generates a feedback signal, thereby preventing decline in performance resulting from changes in process and temperature. Also, the voltage controlled oscillator is beneficially employed in a low power system, and miniaturizable due to a small size of a core transistor, thereby reducing parasitic capacitance and enlarging a tuning range.

While the present invention has been shown and described in connection with the preferred embodiments, it will be apparent to those skilled in the art that modifications and variations can be made without departing from the spirit and scope of the invention as defined by the appended claims.

What is claimed is:

1. A voltage controlled oscillator with body bias control comprising:
 a resonant circuit for generating a resonant frequency in response to a tuning voltage;
 a differential oscillator including first and second transistors differentially cross-coupled to the resonant circuit, the first and second transistors supplying energy to the resonant circuit to oscillate the resonant frequency from the resonant circuit, thereby generating first and second oscillation signals having a phase difference of 180 degree, and adjusting the first and second oscillation signals to a uniform level in response to a body bias voltage; and
 an output level detector for detecting a level of the first and second oscillation signals from the differential oscillator and supplying the body bias voltage corresponding to the detected level to a body of each of the first and second transistors.

2. The voltage controlled oscillator according to claim 1, wherein each of the first and second transistors comprises an n-channel Metal Oxide Semiconductor (MOS) transistor.

3. The voltage controlled oscillator according to claim 2, wherein the first transistor has a drain connected to a first connecting node between a first end of the resonant circuit and a gate of the second transistor, a gate connected to a second connecting node between a second end of the resonant circuit and a drain of the second transistor, a source connected to a ground and a body connected to the body bias voltage of the output level detector.

4. The voltage controlled oscillator according to claim 3, wherein the second transistor has a drain connected to a second connecting node between a second end of the resonant circuit and the gate of the first transistor, a gate connected to the first connecting node between the first end of the resonant circuit and the drain of the first transistor, a source connected to the ground and a body connected to the body bias voltage of the output level detector.

5. The voltage controlled oscillator according to claim 4, wherein the output level detector comprises an n-channel MOS transistor having a drain connected to the first connecting node connected to the first end of the resonant circuit, a gate connected to the second connecting node connected to the second end of the resonant circuit, and a source commonly connected to the bodies of the first and second transistors.

6. The voltage controlled oscillator according to claim 1, wherein each of the first and second transistors comprises a p-channel MOS transistor.

7. The voltage controlled oscillator according to claim 6, wherein the first transistor has a drain connected to a first connecting node between a first end of the resonant circuit and a gate of the second transistor, a gate connected to a second connecting node between a second end of the resonant circuit and a drain of the second transistor, a source connected to a supply voltage and a body connected to the body bias voltage of the output level detector.

8. The voltage controlled oscillator according to claim 7, wherein the second transistor has a drain connected to the second connecting node between the second end of the resonant circuit and the gate of the first transistor, a gate connected to the first connecting node between the first end of the resonant circuit and the drain of the first transistor, a source connected to the supply voltage and a body connected to the body bias voltage of the output level detector.

9. The voltage controlled oscillator according to claim 8, wherein the output level detector comprises a p-channel MOS transistor having a source connected to the first connecting node between the first end of the resonant circuit and the drain of the first transistor, a gate connected to the second connecting node between the second end of the resonant circuit and the drain of the second transistor, and a drain commonly connected to the bodies of the first and second transistors.

* * * * *